Dec. 15, 1964 S. A. FINGERHOOD 3,161,779
COMMON BASE AMPLIFIER RESISTIVELY STABILIZED
Filed Sept. 2, 1959
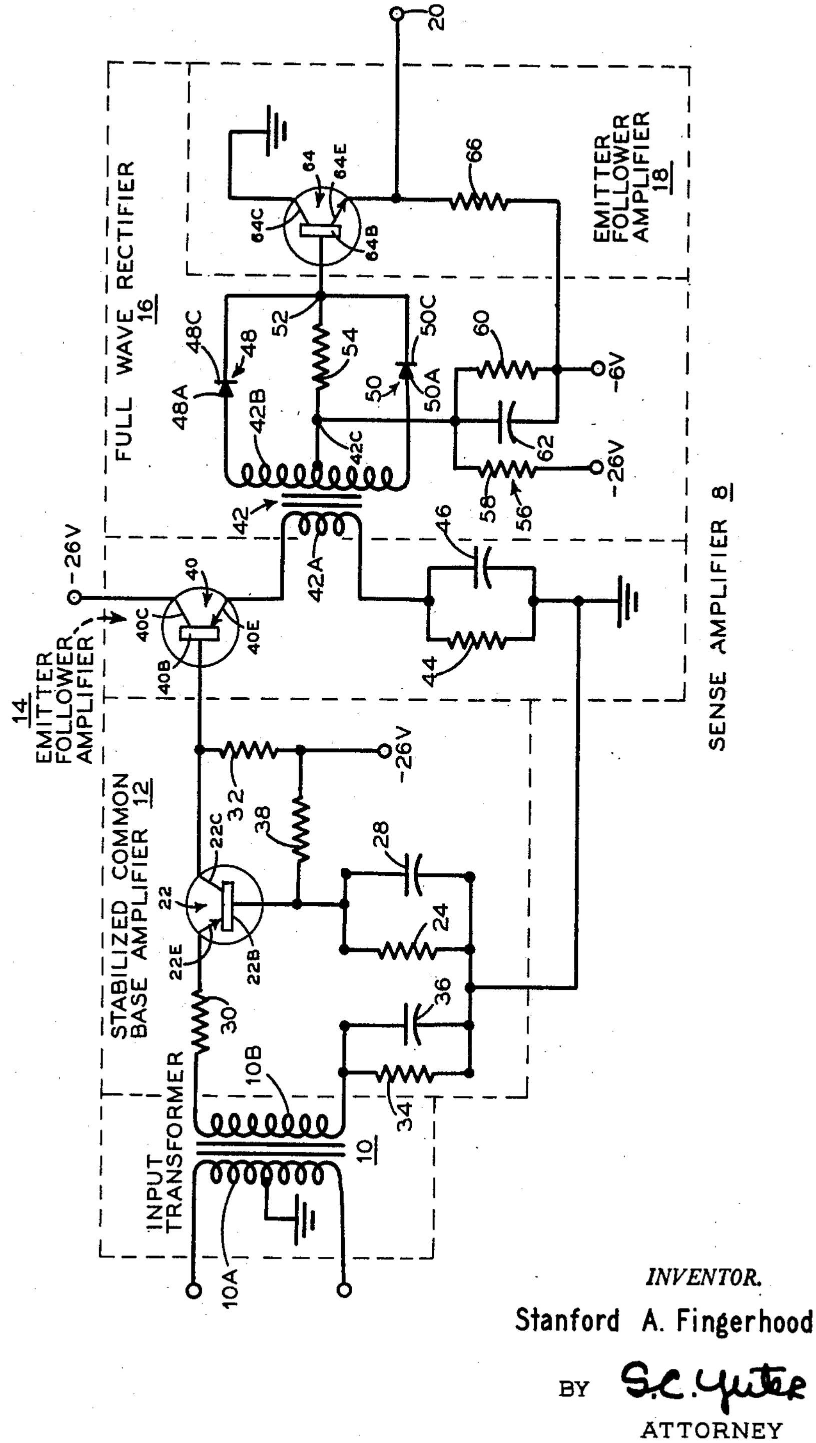
INVENTOR.
Stanford A. Fingerhood
BY S.C. Yuter
ATTORNEY United States Patent Office 3,161,779

Patented Dec. 15, 1964

3,161,779

COMMON BASE AMPLIFIER RESISTIVELY STABILIZED

Stanford A. Fingerhood, New York, N.Y., assignor to Digitronics Corporation, Albertson, N.Y., a corporation of Delaware Filed Sept. 2, 1959, Ser. No. 837,638

8 Claims. (Cl. 307—88.5)

This invention pertains to signal amplifiers and more particularly to high gain and highly stabilized transistor amplifiers.

Although high gain amplifiers have innumerable applications, they fulfill an important need in information storage devices which are of the magnetic core matrix type. Each of the magnetic cores has a sense winding which transmits signals upon interrogation. These sense windings are coupled to a sense amplifier so that the signals may be amplified to usable levels. Since the signals from the sense windings are generally low level and usually contain noise signals, the sense amplifier must have considerable gain, high stability and the ability to discriminate against noise signals.

Heretofore, in order to satisfy the requirements of adequate gain and high stability, negative feedback techniques have been employed. While negative feedback can make the amplifier insensitive to changes in circuit parameters it also decreases the gain of the amplifier. Therefore, when employing negative feedback techniques it is often necessary to cascade several amplifiers whose sole function is to increase the usable gain.

It is accordingly a general object of the invention to provide an improved signal amplifier.

It is another object of the invention to provide an improved high gain signal amplifier that is insensitive to changing circuit parameters.

It is a further object of the invention to provide an improved high-gain amplifier which, while employing transistors, is highly stable.

It is yet another object of the invention to provide an improved sense amplifier which while satisfying the foregoing objects is relatively inexpensive and highly reliable.

Briefly, in accordance with the invention, apparatus is provided for amplifying signals which includes input means for receiving signals and transmitting the signals to a common-base transistor amplifier. An emitter-follower transistor amplifier receives the signals from the common base transistor amplifier and transmits the signals to an amplitude discriminator which is coupled to an output means.

A feature of the invention is a stabilized common-base transistor amplifier which provides an unusually high signal gain.

Other objects, features and advantages of the invention will be apparent from the following detailed description when read with the drawing in which the sole figure shows a sense amplifier that includes a stabilized common base amplifier in accordance with a preferred embodiment of the invention.

Referring to the sole figure, sense amplifier 8 is shown comprising input transformer 10, the stabilized common-base amplifier 12, the emitter-follower amplifier 14, and full-wave rectifier 16 and the emitter-follower amplifier 18 in cascade. Signals are received by the primary winding 10A of input transformer 10 and after amplification are transmitted from the output terminal 20 of the emitter-follower amplifier 18.

The stabilized common-base amplifier 12 comprises the transistor 22, a p-n-p type, having a base 22B coupled via the parallel combination of resistor 24 and by-pass capacitor 28 to ground potential, an emitter 22E coupled to one end of resistor 30, and a collector 22C coupled via resistor 32 to a source of negative potential —26 v.

The other end of resistor 30 is coupled via secondary winding 10B of transformer 10 to one end of the parallel combination of resistor 34 and by-pass capacitor 36 whose other end is coupled to ground potential. Resistor 38 is connected between source of negative potential —26 v. and the base 22B of transistor 22.

Resistor 30 is chosen to have a magnitude at least twice as great as the emitter-collector resistance of transistor 22. Any changes of the input impedance of the stabilized common-base amplifier 12 due to changes in the characteristics of the transistor 22 are accordingly minimized since the resistor 30 comprises the major portion of the input impedance. Similarly, the voltage gain of the stabilized common base amplifier 12 is maintained substantially constant since the output impedance, resistor 32 and emitter-follower amplifier 14, is substantially constant, and the alpha (the ratio of collector current to emitter current) is also substantially constant. The voltage gain of stabilized common-base amplifier 12 is proportional to the product of alpha and the ratio of the output impedance to the input impedance.

Since the quiescent potential of the base 22B of transistor 22 controls the quiescent current through the collector 22C, it is necessary to stabilize the quiescent potential of the base 22B with respect to variations in the source of negative potential —26 v. The quiescent collector current flowing through resistor 32 determines the quiescent collector voltage which is chosen to give maximum linear amplification without introducing distortion due to either saturation or clipping by transistor 22. Resistors 24, 32 and 34 are included to provide this stabilization. In particular, the ratio of the resistances of resistor 32 to resistor 34 is preferably between one-half and two times the ratio of the resistances of resistor 38 to resistor 24 provided the base input resistance is at least ten times greater than the resistance of resistor 24. The base input resistance is substantially equal to the product of resistor 34 and the beta of transistor 22, i.e., the ratio of collector current to base currrent.

Emitter-follower amplifier 14 includes transistor 40, a p-n-p type, having a base 40B coupled to collector 22C, a collector 40C coupled to the source of negative potential —26 v., and an emitter 40E coupled via primary winding 42A of transformer 42 to one end of the parallel combination of resistor 44 and by-pass capacitor 46 whose other end is grounded.

Full-wave rectifier 16 includes the center-tapped secondary winding 42B of transformer 42 having one end coupled to the anode 48A of diode 48 and the other end coupled to the anode 50A of diode 50. The cathodes 48C and 50C of diodes 48 and 50 are coupled together at junction 52. Resistor 54 couples junction 52 to the centertap 42C of secondary winding 42B. Centertap 42C is coupled to a potential divider 56 having resistors 58 and 60 serially disposed between source of negative potential —26 v. and source of negative potential —6 v. The junction of resistors 58 and 60 is coupled to source of negative potential —6 v. via by-pass capacitor 62. The coupling of centertap 42C to potential divider 56 provides about one volt of discrimination for diodes 48 and 50 to prevent noise and other undesired signals from passing from the centertapped secondary winding 42B of transformer 42 to junction 52.

Emitter-follower amplifier 18 comprises transistor 64, of the n-p-n type, having a collector 64C coupled to ground potential, a base 64B coupled to junction 52 and an emitter 64E coupled via resistor 66 to source of negative potential −6 v. Output terminal 20 is connected to emitter 64E.

Although sense amplifier 8 may be used in many applications as a high gain and highly stabilized amplifier, its use as a sensing amplifier in a magnetic core matrix will be described by way of example.

When a magnetic core matrix is interrogated to read out stored information, one of two types of signals is transmitted. If the interrogated magnetic core is storing a bit of information, the sense winding will transmit a signal having sequential positive and negative lobes. If the magnetic core is not storing a bit of information, the sense winding will transmit a signal of considerably smaller amplitude.

The sense windings of the cores are coupled to primary winding 10A of transformer 10. Current flow through primary winding 10A in response to received signals is stepped up and transmitted by input transformer 10 to emitter 22E. A substantially equal current flows from collector 22C through resistor 32. Since the magnitude of resistor 32 is considerably greater than the magnitude of resistor 30, the signal transmitted to base 40B is greatly amplified. It should be noted that since collector 22C is coupled to the base 40B of the transistor 40 of emitter-follower amplifier 14, there is substantially negligible loading of stabilized common-base amplifier 12 and accordingly, its output impedance is substantially only resistor 32.

The signals received by emitter-follower amplifier 14 are transmitted via the primary winding 42A of transformer 42 to full wave rectifier 16. The positive lobes of signals having an amplitude greater than approximately one volt are transmitted via diode 48 to junction 52 and the negative lobes of signals having an amplitude greater than approximately one volt are transmitted via diode 50 to junction 52. Signals of smaller amplitude do not pass to junction 52. Thus, there will only be a signal present at junction 52 when the interrogated magnetic core contains a bit of information. The signals at junction 52 are received by base 64B of the transistor 64 of emitter-follower amplifier 18 which acts as a low impedance source and transmitted from the output terminal 20 coupled to the emitter 64E of transistor 64.

The following parameters for sense amplifier 8 form a working embodiment of the invention and are given by way of example only:

| | |
|---|---|
| Resistor 24 | 1,000 ohms. |
| Resistor 30 | 150 ohms. |
| Resistor 32 | 20,000 ohms. |
| Resistor 34 | 1,000 ohms. |
| Resistor 38 | 27,000 ohms. |
| Resistor 44 | 4,700 ohms. |
| Resistor 54 | 27,000 ohms. |
| Resistor 66 | 1,500 ohms. |
| Capacitor 28 | 5 microfarads. |
| Capacitor 36 | 5 microfarads. |
| Capacitor 46 | 5 microfarads. |
| Capacitor 62 | 5 microfarads. |
| Transistor 22 | GT 1228. |
| Transistor 40 | GT 1228. |
| Transistor 64 | 2N 585. |
| Diode 48 | GT DX3. |
| Diode 50 | GT DX3. |
| Transformer 10 | Turns ratio of 1:2. |
| Transformer 42 | Turns ratio of 1:2. |

There has thus been disclosed an improved sense amplifier which by employing a stabilized common-base amplifier has the qualities of high gain and high stability. The stabilized common-base amplifier, by virtue of the presence of a resistor between the emitter of the transistor and the input terminal, stabilizes the input impedance and by the use of a resistive network in the collector, base and emitter circuits of the transistor, has good direct current stability.

There will now be obvious to those skilled in the art many modifications and variations satisfying the objects and gaining many or all of the advantages but which do not depart from the spirit of the invention as defined by the claims.

What is claimed is:

1. Apparatus for amplifying signals comprising input means with two input signal terminals, a transistor having a base, an emitter and a collector, a source of operating potential having first and second terminals at different potentials, first resistive means connected between said emitter and one signal terminal of said input means, first impedance means connected between the other signal terminal of said input means and said first potential source terminal, second impedance means connected between said base and said first potential source terminal, second resistive means connected between said collector and said second potential source terminal, third resistive means connected between said base and said second potential source terminal, an emitter-follower transistor amplifier having a base, an emitter and a collector, with its base connected to the collector of said first transistor, and with its emitter circuit including an energy-transfer impedance, an amplitude discriminator means connected to be energized from said energy-transfer impedance, said impedance being responsive to said emitter-follower transistor amplifier, and an output means responsive to said amplitude discriminator means.

2. A signal amplifier comprising an input means, a transistor having a base, an emitter and a collector, a source of operating potential having first and second terminals at different potentials, first stabilizing resistive means for coupling said emitter to said input means, first stabilizing impedance means for coupling said input means to said first terminal, second stabilizing impedance means for coupling said base to said first terminal, second stabilizing resistive means for coupling said collector to said second terminal, third resistive means for coupling said base to said second terminal, and output means coupled to said collector.

3. A signal amplifier comprising an input means, a transistor having a base, an emitter and a collector, a source of operating potential having first and second terminals at different potentials, a first resistor connecting said emitter to said input means, a stabilizing second resistor and a first capacitor in parallel circuit relation connecting said input means to said first potential terminal, a stabilizing third resistor and a second capacitor disposed in parallel circuit relation connecting said base to said first terminal, a stabilizing fourth resistor connecting said collector to said second terminal, a fifth resistor connecting said base to said second terminal, and output means connected to said collector.

4. A signal amplifier comprising an input transformer having a primary and a secondary winding, a transistor having a base, an emitter and a collector, a source of operating potential having first and second terminals at different potentials, a stabilizing first resistor and a first capacitor disposed in parallel circuit relation connecting one end of said secondary winding to said first potential terminal, a stabilizing second resistor and a second capacitor disposed in parallel circuit relation and connecting said base to said first potential terminal, a third resistor connecting the other end of said secondary winding to said emitter, a stabilizing fourth resistor connecting said collector to said second potential terminal, a fifth resistor connecting said base to said second potential terminal, and output means connected to said collector.

5. The signal amplifier of claim 4 wherein said third resistor has a resistance at least twice as great as the emitter to base resistance of said transistor.

6. The signal amplifier of claim 4 wherein the product of the resistance of said first resistor and the beta of said transistor is at least ten times greater than the resistance of said second resistor.

7. The signal amplifier of claim 4 wherein the ratio of the resistance of said fourth resistor to the resistance of said first resistor is within the range of one-half to two times the ratio of the resistance of said fifth resistor to the resistance of said second resistor.

8. The signal amplifier of claim 7 wherein the product of the resistance of said first resistor and the beta of said transistor is at least ten times greater than the resistance of said second resistor.

References Cited in the file of this patent

UNITED STATES PATENTS

| | | |
|---|---|---|
| 2,574,690 | Clark | Nov. 13, 1951 |
| 2,760,007 | Lozier | Aug. 21, 1956 |
| 2,854,651 | Kircher | Sept. 30, 1958 |
| 2,863,066 | De Witt et al. | Dec. 2, 1958 |
| 2,878,326 | Cope | Mar. 17, 1959 |
| 2,926,308 | Thanos | Feb. 23, 1960 |
| 3,103,633 | Hartog | Sept. 10, 1963 |